Figure 1:
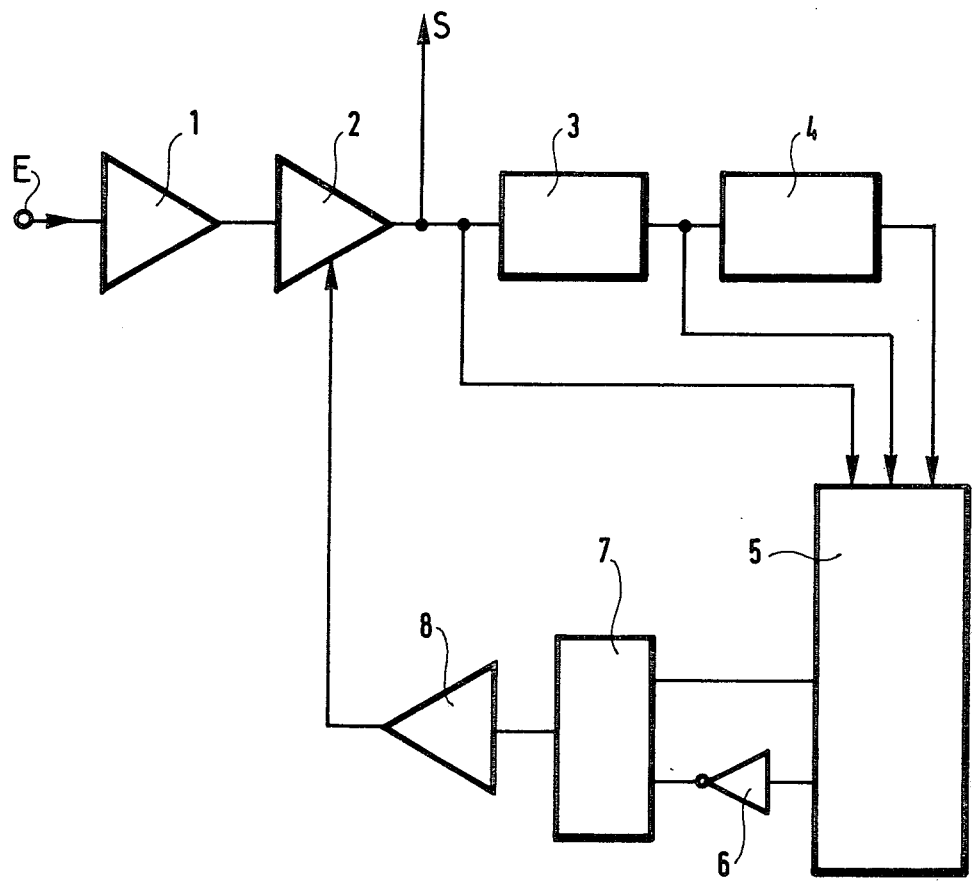

United States Patent [19]

Touzard et al.

[11] 4,260,953

[45] Apr. 7, 1981

[54] AUTOMATIC GAIN CONTROL CIRCUIT

[75] Inventors: Jean-Pierre Touzard, St. Maurice Moncouronne; Hubert Georget, Vincennes, both of France

[73] Assignee: Compagnie Industrielle des Telecommunications Cit-Alcatel, Paris, France

[21] Appl. No.: 28,789

[22] Filed: Apr. 10, 1979

[30] Foreign Application Priority Data

Apr. 24, 1978 [FR] France .................. 78 12029

[51] Int. Cl.³ .............................. H03G 3/30
[52] U.S. Cl. ................... 330/279; 330/284
[58] Field of Search ............... 330/127, 129, 140, 144, 330/145, 278, 279, 284

[56] References Cited

U.S. PATENT DOCUMENTS

| | | | |
|---|---|---|---|
| 2,803,711 | 8/1957 | Wiggin et al. | 330/140 |
| 3,676,792 | 7/1972 | Newton | 330/145 X |
| 3,760,255 | 9/1973 | Grodinsky | 330/127 X |
| 3,895,310 | 7/1975 | Warren | 330/278 X |

Primary Examiner—James B. Mullins
Attorney, Agent, or Firm—Sughrue, Rothwell, Mion, Zinn & Macpeak

[57] ABSTRACT

The invention relates to an automatic gain control circuit for restoring an input signal whose variable level is to be regulated throughout the whole frequency band, in particular to restore the input signal to a constant level. A gain control loop uses n phase shifters (3,4) each phase shifting at the lower limit of the frequency band of the input signal by $2\pi/(n+1)$, being connected in cascade to the output of the circuit and followed by a rectifier and summing circuit (5) acting on the output signals of the circuit (S) and of each of the phase shifters (3 and 4) to generate a single polarity signal which, filtered by a cell (7) with a short time constant, constitutes the gain control signal. The circuit can be used in a modulator-demodulator to transmit data, in particular facsimile signals, over a telephone line.

7 Claims, 2 Drawing Figures

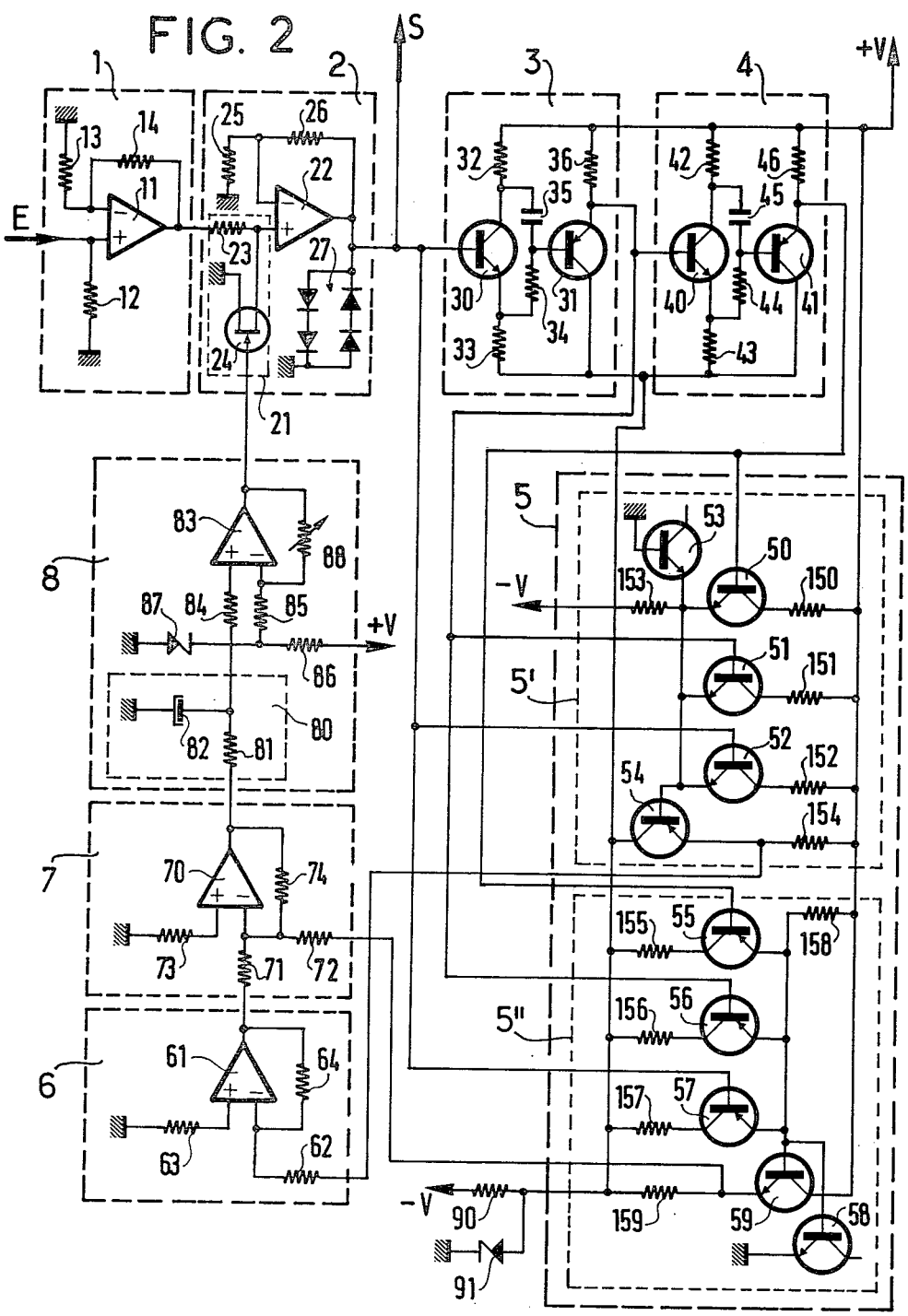

AUTOMATIC GAIN CONTROL CIRCUIT

The present invention relates to an automatic gain control circuit.

In a variable gain amplifier circuit, the automatic control of the gain is provided by means of a gain control loop intended to establish a DC control voltage which is proportional to the level of the input signal on the basis of the output signal of the variable gain amplifier circuit. The DC control voltage adjusts the gain of the variable gain amplifier circuit so as to regulate the output signal.

Preferred embodiments of the present invention can take a signal covering the 600–3000 Hz frequency band and whose level varies from 0 to −45 dB, and regulate the signal so that it has a constant level of 0 dB, whatever its input level may be and with low distortion throughout its whole frequency band.

Such an automatic gain control circuit may be used in a modulator-demodulator (modem) circuit to transmit data, in particular facsimile signals, over a telephone line; it feeds an analog-to-digital converter which, to operate properly, must have a constant-level signal at its input.

The present invention provides an automatic gain control circuit which includes a variable gain amplifier circuit for restoring an input signal of variable level which is to be regulated throughout the whole frequency band of the input signal and a gain control loop in which the amplitude variations of the output signal of the variable gain amplifier circuit generate a DC gain control signal, said circuit being characterized in that said gain control loop includes n phase shifters each of which causes a defined low-frequency phase shift of the frequency band from the input signal to the output signal of said variable gain amplifier and a rectifier and summing circuit connected to the outputs of said variable gain amplifier circuit and of each of said n phase shifters, said rectifier and summing circuit delivering said gain control signal.

Advantageously, the automatic gain control circuit uses, in its control loop, two phase shifters which apply a phase shift of $2\pi/3$ at the lower limit of the frequency band of the input signal, said phase shifters being connected in cascade while the rectifier and summing means invert the half cycles of one polarity and deliver a single-pole signal which has a residual ripple frequency which is greater than the upper limit of the frequency band of the input signal and which is then filtered by a filtering cell of short time constant.

An embodiment of the invention is described by way of example with reference to the accompanying drawings in which:

FIG. 1 is a block of the automatic gain control circuit in accordance with the invention; and FIG. 2 is a circuit diagram which corresponds to the circuit outlined in FIG. 1.

FIG. 1 is a block diagram of an automatic gain control circuit in accordance with the invention. E is the input of the circuit and S is its output. The input signals are applied to a first amplifier circuit 1 whose gain is fixed. The first amplifier circuit 1 is followed by a second amplifier circuit 2 whose gain is variable, on whose output the output signals are delivered which, in this case, must be of constant level, whatever the level input to the second amplifier circuit may be.

The output of the second amplifier circuit is connected to a control loop which regulates the level of the output signal. The control loop includes phase shifters, referenced here 3 and 4, which impart a given phase shift at the lower limit of the band of the signal at the input E. Here, these two phase shifters are identical, for an input signal E lying in the 600 to 3000 Hz band; they shift by $2\pi/3$ at 600 Hz; and they are connected in cascade. A rectifier and summing circuit 5 has its inputs connected respectively to the output of the second amplifier circuit and to the outputs of each of the phase shifters; it has two outputs on which it delivers a signal which is the sum of the positive half-cycles and a signal which is the sum of the negative half-cycles of the signals which it receives. An inverter 6 is connected to one of the outputs of the rectifier and summing circuit 5; its output and the other output of the rectifier and summing circuit 5 are connected to a summing circuit 7 to obtain a signal of single polarity.

This single polarity signal is filtered and amplified in an output circuit 8 of the control loop which delivers a DC voltage proportional to the level of the input signal at E, said voltage controlling the gain of the second amplifier circuit 2 to regulate its output signal at S.

The variations in amplitude of the signal at the output S of the automatic gain control circuit are detected by the control loop and they are converted into a variable DC signal to adjust the gain of the variable gain amplifier circuit and thus to obtain the required regulation.

By using these phase shifters and means for summing the signals at the output S and at the outputs of the various phase shifters to generate the single polarity signal, the residual ripple of the single polarity signal is reduced and the frequency of its residual ripple is increased in comparison to the amplitude and frequency of its residual ripple that would be obtained by full wave rectification of the output signal at S. However, the level of the signal is not modified and it can therefore be used to provide a variable DC gain control signal from a filter cell whose time constant is small. This leads to a circuit with a short response time, e.g. about 2 ms.

Of course, any number n, of phase shifters could be used. In the case where they are connected in cascade, they each should cause a phase shift of $2\pi/(n+1)$ at the lower limit frequency of the frequency band of the input signal, the shift caused by each phase shifter then being reduced for the increasing values of the input signal frequency.

FIG. 2 shows the circuit diagram of an automatic gain control circuit in accordance with the invention, the input E of said circuit receiving a signal whose level varies between 0 and −45 dB in the 600–3000 Hz frequency band and restoring an output signal whose level is constant at 0 dB. The circuit diagram shows the references of the various block circuits included in FIG. 1.

The first amplifier circuit 1 which receives the signal at its input E is constituted by a non-inverting operational amplifier 11 with a gain of 8. Its positive input is connected to the input E and is grounded via a resistor 12. Its negative input is grounded via a resistor 13, while a resistor 14 is connected between its output and the negative input. It drives the second variable gain amplifier circuit 2 at a high level.

The second variable gain amplifier circuit 2 is constituted by an attenuator circuit 21 followed by an operational amplifier 22 whose fixed gain is equal to 100. The attenuator circuit is formed by a resistor 23 connected between the output of the operational amplifier 11 and the positive input of the operational amplifier 22 and by a field effect transistor 24 whose gate receives the control signal and whose other two electrodes are connected between the positive input of the operational amplifier 22 and ground.

The negative input of the operational amplifier 22 is grounded via a resistor 25, while a resistor 26 is connected between its output and its negative input. The field effect transistor operates like a resistor which is variable as a function of the magnitude of the control signal which it receives. The operational amplifier 22 amplifies the attenuated signal to restore it to a constant level (here 0 dB) at the output S of the circuit. A set of protection diodes 27, in two parallel branches connected in opposition, grounds the output of the operational amplifier 22.

To detect the variations in amplitude of the signal at the output S and to generate the DC control signal which is applied to the gate of the field effect transistor 24, the two phase shifters 3 and 4 applying a $2\pi/3$ phase shift at 600 Hz are connected in cascade to the output of the operational amplifier 22. The phase shifter 3 includes two transistors 30 and 31. The base of the NPN type transistor 30 is connected to the output of the operational amplifier 22 and its collector is connected by a resistor 32 to a bias source referenced +V, which is here a +12 volt bias source, while its emitter is connected by a resistor 33 to a circuit which gives a reference voltage which, in this case, is close to −5 volts; the latter circuit is formed by a resistor 90 connected to a −V voltage source, which is here a −12 volt source, and an grounded Zener diode 91.

A resistor 34 connected to the emitter of the transistor 30 and a capacitor 35 connected to the collector of the same transistor are interconnected and connected to the base of the transistor 31. They couple the transistor 30 to the transistor 31, which is an PNP type transistor and is biassed by the +V source connected to its emitter by a resistor 36 and by the reference voltage circuit 90–91 connected to its collector. The output of the phase shifter 3 is formed by the emitter of the transistor 31.

The phase shifter 4 is identical to the phase shifter 3 and includes two transistors 40 and 41. The base of the NPN type transistor is driven by the signal delivered by the phase shifter 3. It is biassed by the +V source connected to its collector by a resistor 42 and by the reference voltage circuit 90–91 connected to its emitter by a resistor 43. A resistor 44 and a capacitor 45 are connected between its emitter and its collector and are connected to the base of the PNP type transistor 41 which is biassed by the +V source connected to its emitter by a resistor 46 and by the reference voltage circuit 90–91 connected to its collector. The output of the phase shifter 4 is formed on the emitter of the transistor 41.

The signals at the output S and at the output of each of the phase shifters 3 and 4 are added in the rectifier and summing circuit 5 which is divided into two stages 5' and 5'' one of which selects half cycles of one polarity and sums them together and the other of which selects half cycles of the other polarity and sums them together, these operations being performed on all three of the signals received by the rectifier and summing circuit 5. The stage 5' includes three NPN transistors 50, 51 and 52 which receive the three signals applied to their respective bases. The collectors of the three transistors are identically biassed by the +V source connected to each collector via a resistor reference 150, 151 or 152 according to the transistor concerned. The emitters of the three transistors are connected in common firstly to the emitter of an NPN type transistor 53 connected as a diode whose base is grounded and secondly to a resistor 153 which is itself connected to the −V source. The three transistors 50, 51 and 52 control an PNP type output transistor 54; the emitters of these three transistors are connected in common to the base of the transistor 54 whose collector is connected to the reference voltage circuit 90–91 and whose emitter is connected to the +V source via a resistor 154. In the stage 5', the transistor 53 fixes the emitter voltage of each of the transistors 50, 51 and 52 at a value close to −0.7 V which turns off each of these transistors for the negative half cycles of the three signals received on their respective bases. The transistor 53 therefore allows each of the signals received by the stage 5' to be rectified without a threshold. The positive half cycles which are then the only ones selected by the transistors 50 to 52 are added in the transistor 54 which delivers to the output of the stage formed on its emitter a signal which is the sum of the positive half cycles of the signals received.

The stage 5'' is analogous to the stage 5': it selects and sums the negative half cycles of the three signals received and includes, for that purpose, three PNP transistors 55, 56 and 57 which receive, on their respective bases, the three preceding signals applied to the stage 5'. The collector of each of the these transistors is connected via a resistor referenced 155, 156 or 157 according to the transistor considered, to the reference voltage circuit 90–91. The emitters of these three transistors are connected in common and are also connected firstly to the base of an NPN type transistor 58 connected as a diode and whose emitter is grounded and secondly to the +V source via a resistor 158. These emitters are also connected to the base of an NPN type output transistor 59 whose collector is connected to the +V source and whose emitter is connected to the reference voltage circuit 90–91 via a resistor 159. In stage 5'', the transistor 58 fixes the emitter voltages of each of the transistors 55, 56 and 57 and turns them off for the positive half cycles of the signals applied on their bases: therefore, it allows the signals received by the stage to be rectified without a threshold and therefore selects only the negative half cycles. The transistor 59 allows the signal which is the sum of the negative half cycles and which is formed on its emitter to be delivered on the output of the stage.

In these two stages 5' and 5'', the output transistors 54 and 59 are biassed to deliver output signals in relation to the same ground reference.

The signal which is the sum of the positive half cycles collected on the emitter of the transistor 54 or which leaves the stage 5' is applied to the inverter 6 constituted by an operational amplifier 61 whose negative input receives the sum signal via a first resistor 62, its positive input being grounded via a resistor 63 and its output being connected in a loop to its negative input via a resistor 64. The signal which is the sum of the positive half cycles is inverted at the output of the amplifier 61 and applied via a resistor 71 to the negative input of an operational amplifier 70 whose negative input receives, via another input 72, the signal which is the sum of the negative half cycles collected on the emitter of the transistor 59 or which leaves the stage 5''. The positive input of the operational amplifier 70 is grounded via a resistor 73 and its output is connected in a loop to its negative input via a resistor 74. The operational amplifier 70 therefore sums the two signals received on its negative input with a new inversion: its output delivers a single polarity signal whose polarity is positive. In the output circuit 8, the single polarity signal is applied to a filter cell 80 with a resistor 81 connected to the output of the operational amplifier 70 and to a grounded capacitor 82; the filter cell has a very low time constant of less than 2 ms. The DC signal delivered by the filter cell is applied to the positive input of an operational amplifier 83 via a resistor 84. The negative input of the amplifier 83 is connected via a resistor 85 to a voltage reference circuit, whose voltage is, here, +5 volts, constituted by a resistor 86 connected to the +V source and a grounded Zener diode 87. The output of the operational amplifier 83 is connected in a loop to its negative input via an adjustable resistor 88 so as to obtain a signal output level of 0 dB. The DC voltage delivered at the output of the operational amplifier 83 is proportional to the level of the input signal at E which is applied to the gate of the field effect transistor 24 to control its variable resistance with the level of the input signal. The circuitry allows the correct attenuation of the signal which comes from E and which is amplified in the circuit 1 as a function of its magnitude, so as to restore it in a very short time, namely about 2 ms, at the 0 dB output S whatever its input level may be. The input level can vary between 0 and −45 dB and with minimum distortion throughout the frequency range of the input signal, here 600 to 3000 Hz.

The present invention has been described with reference to one embodiment illustrated in the drawings and given by way of an example. It is obvious that details can be modified and/or that some means can be replaced by other equivalent means, depending, in particular, on the adjustment required or on the technique used, without thereby going beyond the scope of the invention. In particular, in the attenuator circuit 21, the attenuator device constituted by the resistor 23 and the field effect transistor 24 can be replaced by a current divider attenuator circuitry such as described in the article "Vary Gain Electronically" published on pages 78–81 of the periodical Electronic Design, vol. 19, No. 11 of 27th May, 1971 or an equivalent device.

We claim:

1. An automatic gain control circuit which includes a variable gain amplifier circuit for restoring an input signal of variable level which is to be regulated throughout the whole frequency band of the input signal, and a gain control loop in which the amplitude variations of the output signal of the variable gain amplifier circuit generate a DC gain control signal, said circuit being characterized in that said gain control loop includes n phase shifters wherein n is a whole number greater than 1, each of said phase shifters causing a defined low-frequency phase shift of the frequency band from the input signal to the output signal of said variable gain amplifier and a rectifier and summing circuit connected to the outputs of said variable gain amplifier circuit and of each of said n phase shifters, said rectifier and summing circuit delivering said gain control signal.

2. An automatic gain control circuit according to claim 1, characterized in that said n phase shifters are connected in cascade and are identical, each shifting the phase of the lower limit frequency of the frequency band of the input signal by $2\pi/(n+1)$.

3. An automatic gain control circuit according to claim 1 or 2, characterized in that said rectifier and summing circuit includes two selection and summing stages for the half cycles of the signals received, according to their polarity and a summing circuit connected directly to the output of one of the stages and connected via an inverter to the output of the other stage to deliver a single polarity signal whose amplitude is equal to that of the output of the variable gain amplifier circuit and whose ripple frequency is higher than the upper limit of the frequency band of the input signal.

4. An automatic gain control circuit according to claim 3, characterized in that said stages of the rectifier and summing circuit each comprise n+1 transistors whose bases are driven respectively by the signals received by the circuit and whose emitters are, in each stage, connected in common to a blocking control component, allowing the half cycles of each polarity of the signals received by the circuit to be rectified without a threshold in respective stages of the circuit.

5. An automatic gain control circuit according to claim 4, characterized in that each stage further includes an extra output transistor whose base is connected to the emitters of the n+1 transistors of the stage to control it in these two stages, the two output transistors being biassed to deliver output signals from the stages in relation to the same grounded reference.

6. An automatic gain control circuit according to claim 1 or 2, characterized in that said gain control loop includes a filter cell with a short time constant, connected to the output of said rectifier and summing circuit.

7. An automatic gain control circuit according to claim 1 or 2, characterized in that said variable gain amplifier circuit is constituted by a fixed gain operational amplifier and an input attenuator formed by a resistor and a field effect transistor controlled by said control signal to operate as a variable resistor and to attenuate said input signal as a function of its magnitude.

* * * * *